United States Patent
Gu

(10) Patent No.: US 11,621,679 B2
(45) Date of Patent: Apr. 4, 2023

(54) RADIO FREQUENCY CIRCUIT, METHOD OF TRANSMITTING AND RECEIVING RADIO FREQUENCY SIGNAL, AND WIRELESS COMMUNICATION DEVICE

(71) Applicant: XINPLETEK (SHANGHAI) CO., LTD, Shanghai (CN)

(72) Inventor: Jianzhong Gu, Shanghai (CN)

(73) Assignee: XINPLETEK (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/293,056

(22) PCT Filed: Jan. 27, 2021

(86) PCT No.: PCT/CN2020/092043
§ 371 (c)(1),
(2) Date: May 12, 2021

(87) PCT Pub. No.: WO2021/227125
PCT Pub. Date: Nov. 18, 2021

(65) Prior Publication Data
US 2022/0149793 A1    May 12, 2022

(30) Foreign Application Priority Data

May 9, 2020 (CN) .......................... 202010385148.7

(51) Int. Cl.
*H04B 1/00* (2006.01)
*H04B 1/44* (2006.01)
(Continued)

(52) U.S. Cl.
CPC ............. *H03F 3/19* (2013.01); *H04B 1/0064* (2013.01); *H04B 1/44* (2013.01); *H03F 2200/294* (2013.01); *H03F 2200/451* (2013.01)

(58) Field of Classification Search
None
See application file for complete search history.

(56) References Cited

U.S. PATENT DOCUMENTS 8,325,632 B2 * 12/2012 Gorbachov .......... H04B 7/0817
343/835
10,673,514 B1 * 6/2020 Klomsdorf ............... H04B 1/18
(Continued)

FOREIGN PATENT DOCUMENTS

| CN | 101299840 A | 11/2008 |
| CN | 101572939 A | 11/2009 |

(Continued)

OTHER PUBLICATIONS

International Search Report, issued in PCT/CN2020/092043, dated Jan. 27, 2021.
(Continued)

*Primary Examiner* — Pablo N Tran
(74) *Attorney, Agent, or Firm* — Zhu Lehnhoff LLP

(57) ABSTRACT

Disclosed is a radio frequency circuit, a method of transmitting and receiving radio frequency signals, and a wireless communication device. The radio frequency circuit includes a first radio frequency amplifier, a second radio frequency amplifier, a first channel switch, a first low noise amplifier, a second low noise amplifier, and a second channel switch; the first radio frequency amplifier and the second radio frequency amplifier are connected with a plurality of antennas through the first channel switch, respectively, and are connected with a plurality of SRS antennas through an SRS switch in the first channel switch; the first low noise amplifier and the second low noise amplifier are connected with the plurality of antennas through the first channel switch, respectively, and are connected with a receiver through the second channel switch, respectively; wherein, the first radio frequency amplifier or the second radio frequency amplifier (Continued)

transmits one channel of radio frequency transmission signals to realize one-channel transmission, and the first low noise amplifier and the second low noise amplifier simultaneously receive radio frequency reception signals to realize two-channel reception.

17 Claims, 3 Drawing Sheets

(51) Int. Cl.
*H03F 3/19* (2006.01)
*H04B 7/06* (2006.01)
*H04B 7/08* (2006.01)

(56) References Cited

U.S. PATENT DOCUMENTS

2019/0190563 A1* 6/2019 Sakurai ............... H04B 1/0057
2019/0288715 A1* 9/2019 Bai ..................... H04B 7/0604
2019/0288717 A1* 9/2019 Bai ....................... H03F 3/189
2021/0099205 A1* 4/2021 Seyed ................. H04L 5/0023

FOREIGN PATENT DOCUMENTS

CN 110311696 A 10/2019
WO 2020077536 A1 4/2020

OTHER PUBLICATIONS

Written Opinion, issued in PCT/CN2020/092043, dated Jan. 27, 2021.
OPPO Further discussion on additional IL caused by SRS swich 3GPP TSG_RAN WG4 Meeting #88bis R4-1812719, dated Oct. 12, 2018.

* cited by examiner

RADIO FREQUENCY CIRCUIT, METHOD OF TRANSMITTING AND RECEIVING RADIO FREQUENCY SIGNAL, AND WIRELESS COMMUNICATION DEVICE

TECHNICAL FIELD

The present disclosure relates to the technical field of wireless communication, and more particularly, to a 1T2R radio frequency circuit and a method of transmitting and receiving radio frequency signals.

BACKGROUND ART

As the mobile wireless communication technology develops, 5G mobile technology has been mature and applied in practice. Unlike previous generations of mobile communication technologies, the 5G technology is provided additional novel frequency bands, including n77 3300-4200 MHz, n78 3300-3800 MHz, and n79 4400-5000 MHz. Moreover, in 5G, four-channel simultaneous reception at a single mobile terminal is desirable to enable an improved download rate. The four-channel reception requires four independent antennas in the mobile terminal device, and the four antennas differ from one another in their performance, so it's necessary for the terminal to transmit signals as sounding reference signals (SRS) for uploading to a base station, which enables channel quality detection and estimation, beam management, and the like.

SUMMARY OF THE INVENTION

It is an object of the present disclosure to provide a 1T2R radio frequency circuit, which simplifies the design of a radio frequency front end in a communication device, improves the integration level, and reduces the cost.

In an embodiment of the present disclosure, a 1T2R radio frequency circuit is provided and includes: a first radio frequency amplifier, a second radio frequency amplifier, a first channel switch, a first low noise amplifier, a second low noise amplifier, and a second channel switch;

the first radio frequency amplifier and the second radio frequency amplifier are connected with a plurality of antennas through a first channel switch, respectively, and are connected with a plurality of SRS antennas through an SRS switch in the first channel switch;

the first low noise amplifier and the second low noise amplifier are connected with the plurality of antennas through the first channel switch, respectively, and are connected with a receiver through the second channel switch, respectively; wherein, the first radio frequency amplifier or the second radio frequency amplifier transmits one channel of radio frequency transmission signals to realize one-channel transmission, and the first low noise amplifier and the second low noise amplifier simultaneously receive radio frequency reception signals to realize two-channel reception.

In a preferred embodiment, the first channel switch connects each of the plurality of antennas to a filter, respectively.

In a preferred embodiment, a filter is connected between the first radio frequency amplifier and the first channel switch and between the second radio frequency amplifier and the first channel switch, respectively, and a filter is connected between the first low noise amplifier and the first channel switch and between the second low noise amplifier and the first channel switch.

In a preferred embodiment, n77 or n79 radio frequency transmission signals, amplified by the first radio frequency amplifier or the second radio frequency amplifier, are output, respectively, to the first channel switch and transmitted to the plurality of antennas, and transmitted to the plurality of SRS antennas through the SRS switch in the first channel switch, respectively.

In a preferred embodiment, n77 or n79 radio frequency reception signals are received by any two of the plurality of antennas, respectively, outputted to the first low noise amplifier and the second low noise amplifier through the first channel switch for amplification, and outputted through the second channel switch.

In a preferred embodiment, the first low noise amplifier is connected with an n77 receiver and an n79 receiver, and the second low noise amplifier is connected with an n77 receiver and an n79 receiver.

In a preferred embodiment, the plurality of antennas comprise first to fourth antennas.

In a preferred embodiment, the plurality of SRS antennas comprise first and second SRS antennas.

In another embodiment of the present disclosure, a method of transmitting and receiving radio frequency signals is further provided and includes the steps of:

inputting radio frequency transmission signals to a first radio frequency amplifier or a second radio frequency amplifier, wherein the first radio frequency amplifier or the second radio frequency amplifier is connected with a plurality of antennas through a first channel switch and is connected with a plurality of SRS antennas through an SRS switch in the first channel switch to enable one-channel transmission;

receiving radio frequency transmission and reception signals, respectively, and outputting the radio frequency transmission and reception signals to a first low noise amplifier and a second low noise amplifier through the first channel switch, respectively, by any two antennas in the plurality of antennas;

amplifying the received radio frequency reception signals and outputting the amplified radio frequency reception signals to corresponding receivers through a second channel switch, respectively, by the first low noise amplifier and the second low noise amplifier, to enable two-channel reception.

In another embodiment of the present disclosure, a wireless communication device employing the 1T2R radio frequency circuit mentioned above is further provided.

The method of the present disclosure is more advantageous than the prior art in that:

in the present disclosure, the 1T2R radio frequency circuit has an improved integration level, functional modules such as control lines and amplifiers in the circuit are shared, the design of a radio frequency front end in a communication device is simplified, and the cost is reduced.

The specification of the present disclosure contains a large number of technical features, which can be found in various technical solutions, and it would be too lengthy to list all possible combinations (i.e., technical solutions) of the technical features of the present disclosure. To avoid this problem, the technical features disclosed in the above-mentioned summary of the present disclosure, the technical features disclosed in the following embodiments and examples, and the technical features disclosed in the drawings, can be freely combined to form various new technical solutions, all of which should be considered to have been disclosed in the present disclosure, unless such a combination of technical features is technically infeasible. For example, in one example, feature A+B+C is disclosed, and in another example, feature A+B+D+E is disclosed, while features C and D are equivalent technical means for performing the same function, and it is technically impossible to use them simultaneously as they should be used alternatively, and feature E can be technically combined with feature C, hence a solution of A+B+C+D should not be considered as disclosed because it is infeasible, and a solution of A+B+C+E should be considered as disclosed.

BRIEF DESCRIPTION OF THE DRAWINGS

Non-limiting and non-exhaustive embodiments of the present disclosure are described with reference to the following drawings, wherein like reference numerals refer to like parts throughout the various views unless otherwise specified.

DETAILED DESCRIPTION OF THE INVENTION

In the following description, numerous technical details are set forth to provide the reader with a better understanding of the present disclosure. However, one of ordinary skill in the art appreciates that the technical solutions set forth in the claims herein can be practiced without these specific details and with various changes and modifications based on the following embodiments.

In order that the objects, technical solutions, and advantages of the present disclosure will become more apparent, embodiments thereof will be described in further detail with reference to the accompanying drawings.

Embodiment 1

Figure 1:
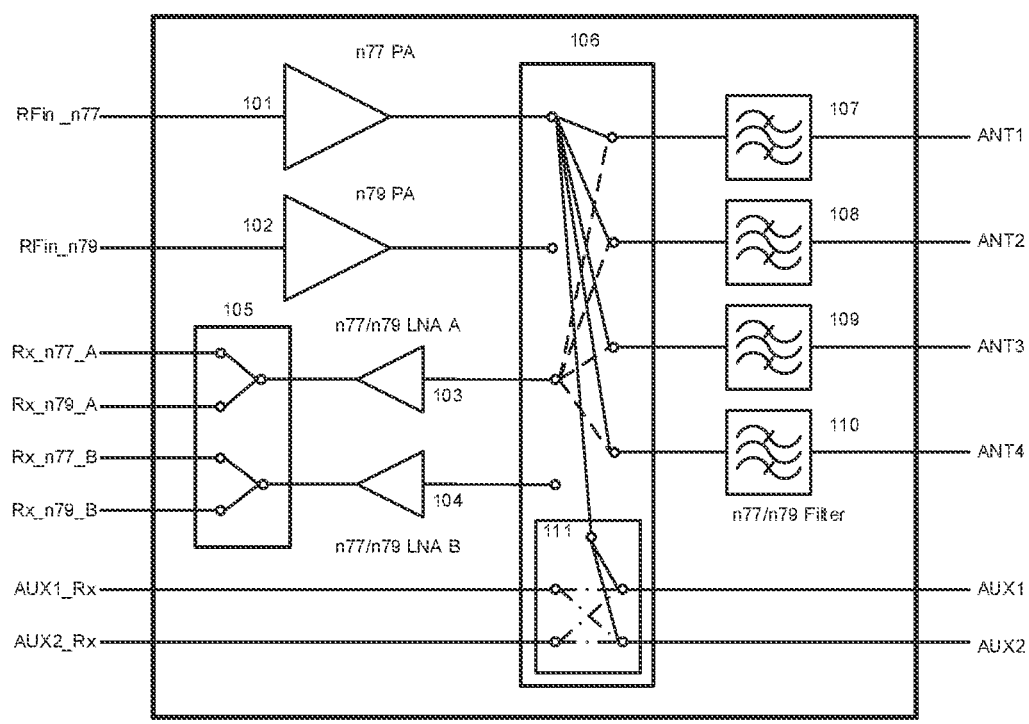
FIG. 1 is a schematic diagram of a 1T2R radio frequency circuit in an embodiment of the present disclosure.

In an embodiment of the present disclosure, a 1T2R radio frequency circuit is provided, and a schematic diagram of the radio frequency circuit is shown in FIG. 1. The radio frequency circuit includes: a first radio frequency amplifier 101, a second radio frequency amplifier 102, a first channel switch 106, a first low noise amplifier 103, a second low noise amplifier 104, a second channel switch 105, and filters 107, 108, 109, and 110.

The first radio frequency amplifier 101 and the second radio frequency amplifier 102 are connected with a plurality of antennas through the first channel switch 106, respectively, and are connected with a plurality of SRS antennas through an SRS switch 111 in the first channel switch 106. In an embodiment, the plurality of antennas include, for example, first to fourth antennas ANT1, ANT2, ANT3, and ANT4. In an embodiment, the plurality of SRS antennas include, for example, first and second SRS antennas AUX1 and AUX2. Herein, the first channel switch 106 is connected with the plurality of antennas ANT1, ANT2, ANT3, and ANT4 through filters 107, 108, 109, and 110, respectively.

The first low noise amplifier 103 and the second low noise amplifier 104 are connected with the plurality of antennas ANT1, ANT2, ANT3, and ANT4 through the first channel switch 106, respectively, and are connected with receivers through the second channel switch 105, respectively. In an embodiment, the first low noise amplifier 103 is connected to an n77 receiver Rx_n77_A and an n79 receiver Rx_n79_A, and the second low noise amplifier 104 is connected to an n77 receiver Rx_n77_B and an n79 receiver Rx_n79_B. In an embodiment, the first and second SRS antennas AUX1 and AUX2 are connected to receivers AUX1_Rx and AUX2_Rx, respectively, via the SRS switch.

In this embodiment, the first radio frequency amplifier 101 or the second radio frequency amplifier 102 transmits radio frequency transmission signals n77 or n79 to enable one-channel transmission, and the first low noise amplifier 103 and the second low noise amplifier 104 simultaneously receive radio frequency reception signals to enable two-channel reception, for example, simultaneously receive two channels of signals n77 or two channels of signals n79.

Specifically, the n77 or n79 radio frequency transmission signals, amplified by the first radio frequency amplifier 101 or the second radio frequency amplifier 102, are output, respectively, to the first channel switch 106 and transmitted to the plurality of antennas ANT1, ANT2, ANT3, and ANT4, and are transmitted to the plurality of SRS antennas AUX1 and AUX2 through the SRS switch 111 in the first channel switch 106, respectively. Radio frequency reception signals n77 or n79 are received by any two of the plurality of antennas ANT1, ANT2, ANT3, and ANT4, respectively, outputted to the first low noise amplifier 103 and the second low noise amplifier 104 through the first channel switch 106 for amplification, and outputted to a corresponding receiver through the second channel switch 105.

In the embodiment, the 1T2R radio frequency circuit has an improved integration level, functional modules such as control lines and amplifiers in the circuit are shared, the design of a radio frequency front end in a communication device is simplified, and the cost is reduced.

The transmission and reception of the radio frequency signals n77 and n79 are described below, respectively.

An implementation of n77 1T: the n77 radio frequency transmission signals are amplified by the radio frequency power amplifier (PA) 101 and transmitted to antennas ANT1, ANT2, ANT3 and ANT4 through the switch 106, and the transmission signals can be transmitted to the SRS antennas AUX1 and AUX2 through the SRS switch in the switch 106. An implementation of n77 2R: any two of the antennas ANT1, ANT2, ANT3, and ANT4 can be selected to receive the n77 radio frequency reception signals, channel-A signals enter the switch 106 from the antenna and are switched to the low noise amplifier (LNA) 103 through the switch 106 for amplification, after this, the signals enter the switch 105 and then to a port of the receiver Rx_n77_A; channel-B signals enter the switch 106 from the antenna and are switched to the low noise amplifier (LNA) 104 for amplification, after this, the signals enter the switch 105 and then to a port of the receiver Rx_n77_B.

An implementation of N79 1T: the n79 radio frequency transmission signals are amplified by the radio frequency power amplifier 102 and transmitted to ANT1, ANT2, ANT3, and ANT4 through the switch 106, and the transmission signals can be transmitted to the SRS antennas AUX1 and AUX2 through the SRS switch in the switch 106. An implementation of n79 2R: any two of the antennas ANT1, ANT2, ANT3, and ANT4 can be selected to receive the n79 radio frequency reception signals, channel-A signals enter the switch 106 from the antenna and are switched to the low noise amplifier (LNA) 103 through the switch 106 for amplification, after this, the signals enter the switch 105 and then to a port of the receiver Rx_n79_A; channel-B signals enter the switch 106 from the antenna and are switched to the low noise amplifier (LNA) 104 for amplification, after this, the signals enter the switch 105 and then to a port of the receiver Rx_n79_B.

In the embodiment, an SRS function is integrated in the switch 106, and the n77 and n79 transmitting power can be transmitted to AUX1 and AUX2 ports through the SRS switch, so that the SRS function is enabled for additional two channels of antennas. Moreover, the SRS switch is provided with an additional DPDT function, so that the signals received at the AUX1 and AUX2 ports can be switched to be output to AUX1_Rx and the AUX2_Rx through the SRS switch.

Embodiment 2

Figure 2:
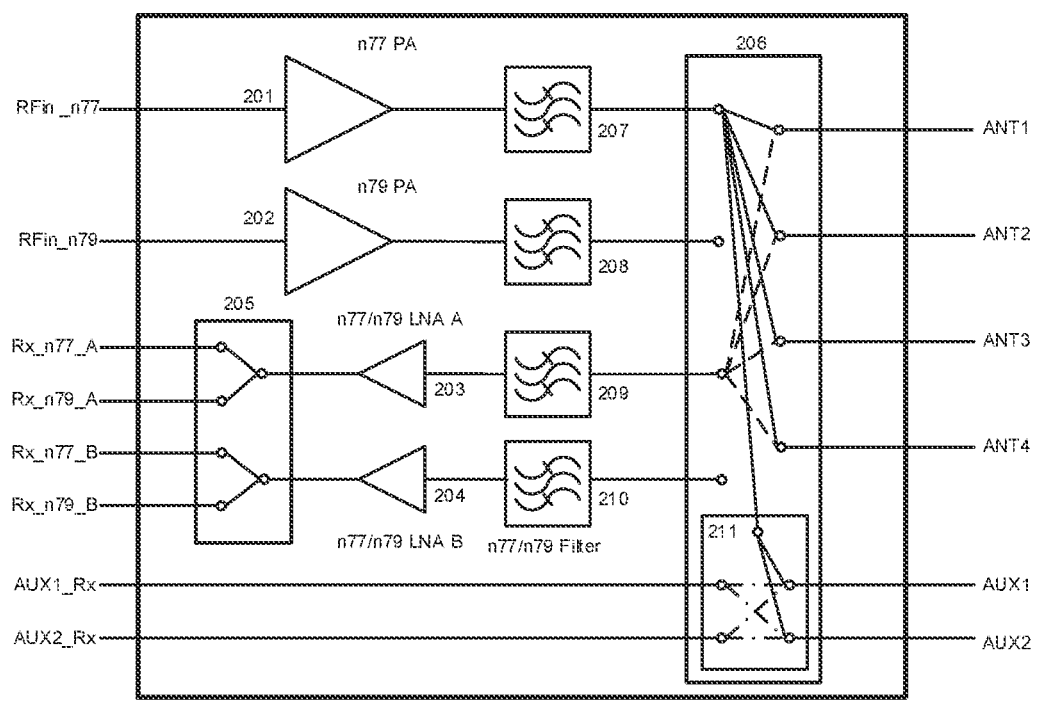
FIG. 2 is a schematic diagram of a 1T2R radio frequency circuit in an embodiment of the present disclosure.

The radio frequency circuit of this embodiment is basically the same as the radio frequency circuit of Embodiment 1, and differs only in that: the filter is located between the radio frequency amplifier or a ground noise amplifier and the first channel switch, rather than between the first channel switch and the antenna. Specifically, referring to FIG. 2, a filters 207 is connected between the first radio frequency amplifier 101 and the first channel switch 205, and a filter 208 is connected between the second radio frequency amplifier 202 and the first channel switch 205, respectively; a filter 209 is connected between the first low noise amplifier 203 and the first channel switch 206, and a filter 210 is connected between the second low noise amplifier 204 and the first channel switch 206, respectively.

The transmission and reception of the radio frequency signals n77 and n79 are described below, respectively.

An implementation of n77 1T: the n77 radio frequency transmission signals are amplified by the radio frequency power amplifier (PA) 201 and transmitted to antennas ANT1, ANT2, ANT3 and ANT4 through the filter 207 and then the switch 106, and the transmission signals can be transmitted to the SRS antennas AUX1 and AUX2 through the SRS switch in the switch 106. An implementation of n77 2R: any two of the antennas ANT1, ANT2, ANT3, and ANT4 can be selected to receive the n77 radio frequency reception signals, channel-A signals enter the switch 106 from the antenna and are input to the low noise amplifier (LNA) 203 through the switch 106 and then the filter 209 for amplification, after this, the signals enter the switch 205 and then to a port of the receiver Rx_n77_A; channel-B signals enter the switch 106 from the antenna and are input to the low noise amplifier (LNA) 204 through the filter 210 for amplification, after this, the signals enter the switch 205 and then to a port of the receiver Rx_n77_B.

An implementation of n79 1T: the n79 radio frequency transmission signals are amplified by the radio frequency power amplifier 202 and transmitted to antennas ANT1, ANT2, ANT3, and ANT4 through the filter 208 and then the switch 106, and the transmission signals can be transmitted to AUX1 and AUX2 through the SRS switch in the switch 106. An implementation of n79 2R: any two of the antennas ANT1, ANT2, ANT3, and ANT4 can be selected to receive the n79 radio frequency reception signals, channel-A signals enter the switch 106 from the antenna and are input to the low noise amplifier (LNA) 203 through the switch 106 and then the filter 209 for amplification, after this, the signals enter the switch 205 and then to a port of the receiver Rx_n79_A; channel-B signals enter the switch 106 from the antenna and are input to the low noise amplifier (LNA) 204 through the filter 210 for amplification, after this, the signals enter the switch 105 and then to a port of the receiver Rx_n79_B.

Also, in this embodiment, the SRS function is integrated in the switch 206, and the n77 and n79 transmission signals can be transmitted to the AUX1 and AUX2 ports through the SRS switch, so that the SRS function is enabled for additional two channels of antennas. Moreover, the SRS switch is provided with an additional DPDT function, so that the signals received at the AUX1 and AUX2 ports can be switched to be output to AUX1_Rx and the AUX2_Rx through the SRS switch.

Embodiment 3

Figure 3:
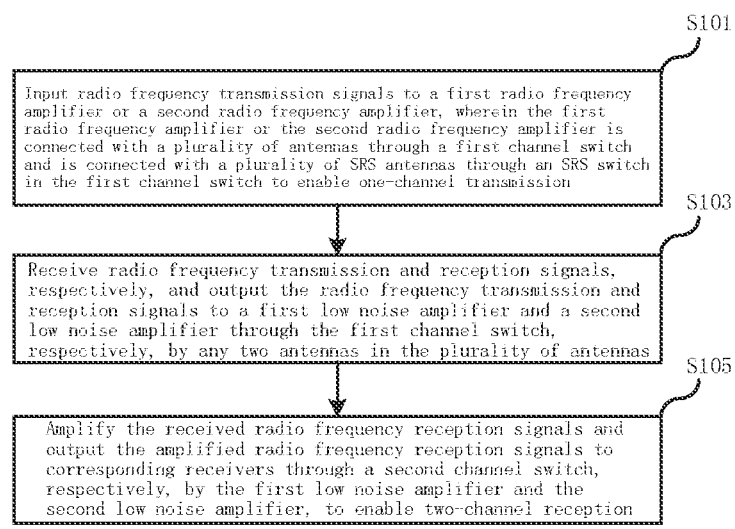
FIG. 3 is a flow chart of a method of transmitting and receiving radio frequency signals in an embodiment of the present disclosure.

In another embodiment of the present disclosure, a method of transmitting and receiving radio frequency signals is further provided, and FIG. 3 shows a flow chart of the method, the method including the steps of:

S101, inputting radio frequency transmission signals to a first radio frequency amplifier or a second radio frequency amplifier, wherein the first radio frequency amplifier or the second radio frequency amplifier is connected with a plurality of antennas through a first channel switch and is connected with a plurality of SRS antennas through an SRS switch in the first channel switch to enable one-channel transmission; and S103, receiving radio frequency transmission and reception signals, respectively, and outputting the radio frequency transmission and reception signals to a first low noise amplifier and a second low noise amplifier through the first channel switch, respectively, by any two antennas in the plurality of antennas;

S105, amplifying the received radio frequency reception signals and outputting the amplified radio frequency reception signals to corresponding receivers through a second channel switch, respectively, by the first low noise amplifier and the second low noise amplifier, to enable two-channel reception.

In another embodiment of the present disclosure, a wireless communication device employing the radio frequency circuit described above is further disclosed. The wireless communication devices contemplated by embodiments of the present disclosure may include electronic devices or network devices, and the electronic devices may include various wireless communicative handheld devices, in-vehicle devices, wearable devices, computing devices, or other processing devices linked to a wireless modem, as well as various forms of user devices, mobile terminals, terminal devices, etc.

It should be noted that in this application for patent, relational terms such as first and second are used solely to distinguish one entity or operation from another entity or operation without necessarily requiring or implying any such actual relationship or order among such entities or operations. Moreover, the term "comprise", "include", or any other variation thereof, is intended to indicate a non-exclusive inclusion, such that a process, method, article, or apparatus that includes a list of elements does not include only those elements shown but may include other elements not expressly listed or inherent to such process, method, article, or apparatus. An element defined by the phrase "comprising a/one . . . " does not, without more constraints, preclude the existence of additional identical elements in the process, method, article, or apparatus that includes the element. In the application documents of the present disclosure, if it is mentioned that an act is performed according to an element, it means that the act is performed at least according to the element, including two cases where the act is performed only according to the element, and according to the element and other elements. Terms like "multiple", "multiple times", and "multiple kinds" include two, twice, and two kinds, as well as more than two, more than twice, and more than two kinds.

All documents mentioned in this specification are considered to be incorporated in the disclosure of the present application in their entirety, to serve as a basis of modification where necessary. In addition, it is to be understood that the foregoing shows only preferred embodiments of the disclosure and is not intended to limit the scope thereof. Any modifications, equivalents, improvements that come within the spirit and principles of one or more embodiments of this disclosure are intended to be included within the scope of the one or more embodiments of this disclosure.

In some cases, the acts or steps recited in the claims may be performed in a different order than in the embodiments and still achieve the desired results. In addition, the processes depicted in the drawings do not necessarily require the particular order shown, or the sequential order, to achieve the desired results. In some embodiments, multitasking and parallel processing may also be possible or may be advantageous.

The invention claimed is:

1. A radio frequency circuit, comprising: a first radio frequency amplifier, a second radio frequency amplifier, a first channel switch, a first low noise amplifier, a second low noise amplifier, and a second channel switch;
    the first radio frequency amplifier and the second radio frequency amplifier being connected with a plurality of antennas through a first channel switch, respectively, and being connected with a plurality of SRS antennas through an SRS switch in the first channel switch;
    the first low noise amplifier and the second low noise amplifier being connected with the plurality of antennas through the first channel switch, respectively, and being connected with a receiver through the second channel switch, respectively; wherein,
    the first radio frequency amplifier or the second radio frequency amplifier transmits radio frequency transmission signals to realize one-channel transmission, and the first low noise amplifier and the second low noise amplifier simultaneously receive radio frequency reception signals to realize two-channel reception, the radio frequency transmission signals, amplified by the first radio frequency amplifier or the second radio frequency amplifier, are output, respectively, to the first channel switch and transmitted to the plurality of antennas, and are transmitted to the plurality of SRS antennas through the SRS switch, respectively; radio frequency reception signals are received by any two of the plurality of antennas, respectively, outputted to the first low noise amplifier and the second low noise amplifier through the first channel switch for amplification, the SRS switch is provided with an additional DPDT function, so that the signals received at the AUX1 and AUX2 ports can be switched to be output to AUX1_Rx and the AUX2_Rx through the SRS switch.

2. The radio frequency circuit according to claim 1, wherein the first channel switch connects each of the plurality of antennas to a filter, respectively.

3. The radio frequency circuit according to claim 1, wherein a filter is connected between the first radio frequency amplifier and the first channel switch and between the second radio frequency amplifier and the first channel switch, respectively, and a filter is connected between the first low noise amplifier and the first channel switch and between the second low noise amplifier and the first channel switch.

4. The radio frequency circuit according to claim 1, wherein n77 or n79 radio frequency transmission signals, amplified by the first radio frequency amplifier or the second radio frequency amplifier, are output, respectively, to the first channel switch and transmitted to the plurality of antennas, and transmitted to the plurality of SRS antennas through the SRS switch in the first channel switch, respectively.

5. The radio frequency circuit according to claim 1, wherein n77 or n79 radio frequency reception signals are received by any two of the plurality of antennas, respectively, outputted to the first low noise amplifier and the second low noise amplifier through the first channel switch for amplification, and outputted through the second channel switch.

6. The radio frequency circuit according to claim 5, wherein the first low noise amplifier is connected with an n77 receiver and an n79 receiver, and the second low noise amplifier is connected with an n77 receiver and an n79 receiver.

7. The radio frequency circuit according to claim 1, wherein the plurality of antennas comprise first to fourth antennas.

8. The radio frequency circuit according to claim 1, wherein the plurality of SRS antennas comprise first and second SRS antennas.

9. A method of transmitting and receiving radio frequency signals, comprising the steps of:
    inputting radio frequency transmission signals to a first radio frequency amplifier or a second radio frequency amplifier, wherein the first radio frequency amplifier or the second radio frequency amplifier is connected with a plurality of antennas through a first channel switch and is connected with a plurality of SRS antennas through an SRS switch in the first channel switch to enable one-channel transmission;
    receiving radio frequency transmission and reception signals, respectively, and outputting the radio frequency transmission and reception signals to a first low noise amplifier and a second low noise amplifier through the first channel switch, respectively, by any two antennas in the plurality of antennas; and
    amplifying the received radio frequency reception signals and outputting the amplified radio frequency reception signals to corresponding receivers through a second channel switch, respectively, by the first low noise amplifier and the second low noise amplifier, to enable two-channel reception, the radio frequency transmission signals, amplified by the first radio frequency amplifier or the second radio frequency amplifier, are output, respectively, to the first channel switch and transmitted to the plurality of antennas, and are transmitted to the plurality of SRS antennas through the SRS switch, respectively; radio frequency reception signals are received by any two of the plurality of antennas, respectively, outputted to the first low noise amplifier and the second low noise amplifier through the first channel switch for amplification, the SRS switch is provided with an additional DPDT function, so that the signals received at the AUX1 and AUX2 ports can be switched to be output to AUX1_Rx and the AUX2_Rx through the SRS switch.

10. A wireless communication device, comprising: the radio frequency circuit according to claim 8.

11. A wireless communication device, comprising: the radio frequency circuit according to claim 7.

12. A wireless communication device, comprising: the radio frequency circuit according to claim 6.

13. A wireless communication device, comprising: the radio frequency circuit according to claim 5.

14. A wireless communication device, comprising: the radio frequency circuit according to claim 4.

15. A wireless communication device, comprising: the radio frequency circuit according to claim 3.

16. A wireless communication device, comprising: the radio frequency circuit according to claim 2.

17. A wireless communication device, comprising: the radio frequency circuit according to claim 1.

\* \* \* \* \*